(12) United States Patent
Lindgren et al.

(10) Patent No.: US 8,089,135 B2
(45) Date of Patent: Jan. 3, 2012

(54) BACK-END-OF-LINE WIRING STRUCTURES WITH INTEGRATED PASSIVE ELEMENTS AND DESIGN STRUCTURES FOR A RADIOFREQUENCY INTEGRATED CIRCUIT

(75) Inventors: Peter J. Lindgren, Essex Junction, VT (US); Anthony K. Stamper, Williston, VT (US)

(73) Assignee: International Business Machine Corporation, Armonk, NY (US)

( * ) Notice: Subject to any disclaimer, the term of this patent is extended or adjusted under 35 U.S.C. 154(b) by 825 days.

(21) Appl. No.: 12/182,585

(22) Filed: Jul. 30, 2008

(65) Prior Publication Data
US 2010/0025853 A1 Feb. 4, 2010

(51) Int. Cl.
*H01L 21/02* (2006.01)

(52) U.S. Cl. ................ 257/532; 257/E29.218

(58) Field of Classification Search .......... 257/528, 257/532, E29.218; 361/760–764, 767, 768, 361/776, 783
See application file for complete search history.

(56) References Cited

U.S. PATENT DOCUMENTS

| | | | |
|---|---|---|---|
| 6,329,234 B1 | 12/2001 | Ma et al. | |
| 6,466,427 B1 * | 10/2002 | Chen | 361/306.3 |
| 6,852,167 B2 | 2/2005 | Ahn | |
| 7,026,237 B2 | 4/2006 | Lamb, III et al. | |
| 7,115,196 B2 | 10/2006 | Chen et al. | |
| 2004/0256654 A1 * | 12/2004 | Korner et al. | 257/306 |
| 2007/0190718 A1 * | 8/2007 | Coolbaugh et al. | 438/253 |
| 2007/0232048 A1 | 10/2007 | Miyata et al. | |
| 2007/0290272 A1 * | 12/2007 | Coker et al. | 257/379 |

OTHER PUBLICATIONS

U.S. Patent and Trademark Office, Notice of Allowance dated as mailed on Apr. 1, 2009 for related U.S. Appl. No. 12/182,554.
U.S. Patent and Trademark Office, Notice of Allowance dated as mailed on Jul. 1, 2009 for related U.S. Appl. No. 12/182,554.

* cited by examiner

*Primary Examiner* — Jenny L Wagner
(74) *Attorney, Agent, or Firm* — Wood, Herron & Evans, LLP

(57) ABSTRACT

Back-end-of-line (BEOL) wiring structures that include a passive element, such as a thin film resistor or a metal-insulator-metal capacitor, and multiple-height vias in a metallization level, as well as design structures for a radiofrequency integrated circuit. The wiring structures generally include a first metal-filled via in a dielectric layer having sidewalls that intersect the passive element and a second metal-filled via in the dielectric layer with sidewalls that do not intersect the passive element. The bottom of the first via includes a conductive layer that operates as an etch stop to prevent deepening of the sidewalls of the first via into a portion of the passive element when the second via is fully etched through the dielectric layer. A liner is applied to the layer of conductive material and the sidewalls of the first via, and the remaining space is filled with another conductive layer.

16 Claims, 8 Drawing Sheets

BACK-END-OF-LINE WIRING STRUCTURES WITH INTEGRATED PASSIVE ELEMENTS AND DESIGN STRUCTURES FOR A RADIOFREQUENCY INTEGRATED CIRCUIT

CROSS-REFERENCE TO RELATED APPLICATIONS

This application is related to application Ser. No. 12/182,554, entitled "METHODS OF FABRICATING A BACK-END-OF-LINE WIRING STRUCTURE WITH INTEGRATED PASSIVE ELEMENTS", which is hereby incorporated by reference herein in its entirety.

BACKGROUND

The invention relates generally to BEOL wiring structures and design structures, and more particularly to BEOL wiring structures that contain on-chip passive elements and to design structures for use with radiofrequency integrated circuits.

Communications systems rely on circuit boards that integrate discrete passive elements, such as high-Q inductors, capacitors, varactors, and ceramic filters, for matching networks, LC tank circuits in voltage controlled oscillators, attenuators, power dividers, filtering, switching, decoupling, and reference resonators. Circuit board dimensions and component counts are being consistently reduced by contemporary designs for circuitry used in mixed signal or high frequency radiofrequency applications found in communications systems. Unfortunately, off-chip passive elements consume a substantial fraction of the total surface area on the circuit board. Consequently, in more compact designs, off-chip passive elements are being replaced by on-chip passive elements.

On-chip passive elements are commonly used in many types of integrated circuits, such as radiofrequency integrated circuits (RFICs). Metal-insulator-metal (MIM) capacitors and thin film resistors represent two types of on-chip passive elements commonly employed in many types of integrated circuits, including RFICs. A two-electrode MIM capacitor is a stacked structure that includes upper and lower conductive plates, which operate as electrodes, and an interplate dielectric layer disposed between the upper and lower conductive plates. A thin film resistor is formed depositing and patterning a resistive material to a desired size and geometrical shape.

Back-end-of-line (BEOL) interconnect structure used to electrically connect the device structures fabricated on the substrate during front-end-of-line (FEOL) processing. A popular method of forming a BEOL interconnect structure is a dual damascene process in which vias and trenches in various dielectric layers are filled with metal in the same process step to create multi-level, high density metal interconnections. In a via-first, trench-last dual damascene processing process, vias are initially formed in a dielectric layer and then trenches are formed in the dielectric layer above the vias. During the etching process forming the trenches, the vias are unfilled. The trenches and vias are filled with metal using a single blanket deposition followed by planarization. In contrast, a single damascene process forms vias and trenches in distinct dielectric layers and then fills them separately with metal.

On-chip MIM capacitors and on-chip resistors are integrated into one of the dielectric layers in a metallization level of the BEOL interconnect structure. The presence of these on-chip passive elements requires the use of an etching process to define vias of multiple different depths in the dielectric layer. Certain vias are taller than other vias because the top plane of the on-chip passive element is above the top plane of the underlying metallization level shared with the on-chip passive element. In a two-electrode MIM capacitor, for example, vias of multiple different depths are defined for use in establishing electrical contacts with the top and bottom conductive plates, which are located at different depths in the dielectric layer, as well as electrical contacts with conductive features in the dielectric layer of an underlying lower level of the interconnect structure.

Conventional MIM capacitors and BEOL-based thin film resistors are commonly composed of refractory materials like tantalum nitride (TaN) and titanium nitride (TiN), which exhibit superior electrical and mechanical properties in comparison with other traditional types of materials. These materials are also commonly available in copper (Cu) BEOL technologies. Overetch is used during via formation to reliably guarantee penetration through etch stop layers incorporated into the device structure. A problem encountered with on-chip passive elements and the need for vias of different depths is that, during overetch, certain vias may penetrate completely through the refractory metal of one or both of the conductive plates of the MIM capacitor or the refractory metal of the shaped object constituting the thin film resistor. If such a punchthrough event occurs, then a circuit reliability problem or even a catastrophic failure resulting in a nonfunctional chip may occur. For example, the conductive plates of a MIM capacitor may be shorted together by the conductor filling a via etched completely through the top conductive plate and interplate dielectric to the bottom conductive plate. As via heights are scaled downwardly, the height difference among the multiple depth vias is reduced. As a result, the sensitivity of the passive elements to overetch may be exacerbated and the passive elements may be more prone to punchthrough events.

Improved device structures are needed for BEOL wiring structures containing on-chip passive elements, such as MIM capacitors or thin film resistors, as well as related design structures for a RFIC, that alleviate problems associated with damage to passive elements caused by overetch of multiple-height vias.

BRIEF SUMMARY

Generally, wiring structures are provided that include a passive element, such as a resistor or a metal-insulator-metal (MIM) capacitor, as well as design structures for a radiofrequency integrated circuit (RFIC). The wiring structures are fabricated as part of a back-end-of-line (BEOL) interconnect structure.

In one embodiment, the BEOL wiring structure includes a dielectric layer, a passive element between the top and bottom surfaces of the dielectric layer, and a via in the first dielectric layer. The via includes a plurality of sidewalls that intersect a portion of the passive element. A first conductive layer is disposed on the portion of the passive element and extending between the sidewalls of the via. A second conductive layer is disposed on the sidewalls of the via and on the first conductive layer. A third conductive layer, which is also disposed in the via, is separated from the sidewalls of the via and from the first conductive layer by respective portions of the second conductive layer.

The first conductive layer operates as an etch stop to prevent deepening of the sidewalls of the via into the portion of the passive element. Because of the presence of the first conductive layer acting as an etch stop in any via that intersects the passive element, vias may be formed in a BEOL wiring structure containing on-chip passive elements without experiencing the conventional problems associated with damage to passive elements caused by overetch of multiple-height vias and punchthrough events.

In another embodiment, the wiring structure is included in a design structure, which embodied in a machine readable medium for designing, manufacturing, or testing an integrated circuit. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
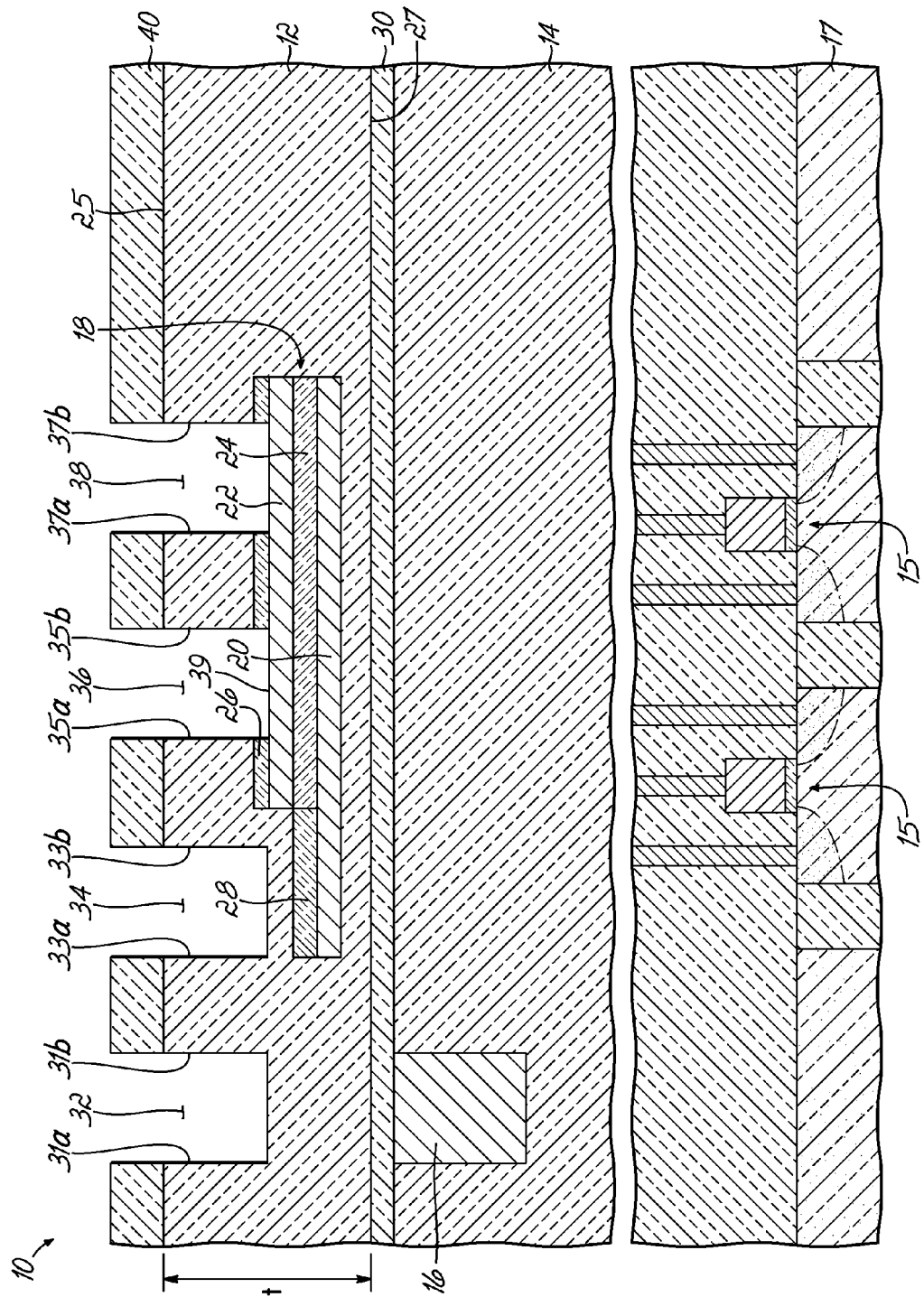
FIG. 1 is a diagrammatic cross-sectional view of a portion of a BEOL wiring structure with an integrated MIM capacitor at an initial fabrication stage of a processing method in accordance with an embodiment of the invention.

With reference to FIG. 1 and in accordance with an embodiment of the invention, a back-end-of-line (BEOL) wiring structure, generally indicated by reference numeral 10, includes a dielectric layer 12 of a metallization level ($M_x$), a dielectric layer 14 of a metallization level ($M_{x-1}$) underlying the metallization level ($M_x$), and a conductive feature 16, such as a metal line, embedded in the dielectric layer 14 of metallization level ($M_x$). Additional metallization levels (not shown) may exist below the metallization level ($M_{x-1}$) and additional metallization levels (not shown) may exist above the metallization level ($M_x$). Conductive features in the different metallization levels interconnect devices of an integrated circuit and may provide circuit-to-circuit connections, or may establish contacts with input and output terminals.

A metal-insulator-metal (MIM) capacitor 18 is embedded in the dielectric layer 12. Multiple depositions of dielectric material may be executed in stages to form the dielectric layer 12 and provide an embedded state for the MIM capacitor 18. For example, the portion of the dielectric layer 12 beneath the MIM capacitor 18 may be deposited before the MIM capacitor 18 is constructed and, then, the portion of the dielectric layer 12 surrounding and above the MIM capacitor 18 may be deposited and planarized to eliminate uneven topography originating from the MIM capacitor 18 buried in the initially deposited portion.

The MIM capacitor 18 represents an on-chip passive element associated with a radiofrequency integrated circuit (RFIC), which includes active devices 15 fabricated by front-end-of-line (FEOL) processes using a substrate 17. The device design for such RFICs and methods for device construction are understood by a person having ordinary skill in the art. The substrate 17 may be a wafer composed of a semiconductor material including, but not limited to, silicon (Si), silicon germanium (SiGe), a silicon-on-insulator (SOI) layer, and other like silicon-containing semiconductor materials.

The MIM capacitor 18 has a stacked structural arrangement that includes a bottom conductive plate 20, a top conductive plate 22, and an interplate dielectric layer 24 disposed between the bottom and top conductive plates 20, 22. The interplate dielectric layer 24, which is typically thinner than the bottom and top conductive plates 20, 22, functions to electrically isolate the top conductive plate 22 from the bottom conductive plate 20. The top conductive plate 22 is disposed closer to a top surface 25 of dielectric layer 12 than the bottom conductive plate 20, which is disposed nearer to a bottom surface 27 of the dielectric layer 12.

The MIM capacitor 18, which has a two-electrode construction in the representative embodiment, can have a different construction recognized by a person having ordinary skill in the art. For example, additional conductive plates and interplate dielectric layers (not shown) can be added to the construction of the MIM capacitor 18 to provide three-electrode, four-electrode, etc. constructions.

The bottom and top conductive plates 20, 22 of the MIM capacitor 18 may be composed of a refractory metal, such as titanium nitride (TiN), tantalum nitride (TaN), tantalum (Ta), tungsten (W), tungsten nitride (WN), ternary materials like titanium silicon nitride (TiSiN), tantalum silicon nitride (TaSiN), and tungsten silicon nitride (WSiN), which may be deposited by direct current (DC) sputtering or radio frequency (RF) sputtering. The bottom and top conductive plates 20, 22 of the MIM capacitor 18 may have multi-layered combinations of these refractory metals, such as either W or Ta clad below and above with either TiN or TaN, and other like materials. The interplate dielectric layer 24 may be composed of silicon dioxide ($SiO_2$), silicon nitride ($Si_3N_4$), aluminum oxide ($Al_2O_3$), zirconium oxide ($ZrO_2$), tantalum pentoxide ($Ta_2O_5$), a hafnium-based dielectric material like hafnium oxide ($HfO_2$), a hafnium silicate (HfSiO), or hafnium oxynitride (HfSiON), layered stacks of these materials, and other like materials. These types of insulators may be deposited by atomic layer deposition (ALD), a chemical vapor deposition (CVD) process, or another conventional deposition technology.

The thicknesses of the bottom and top conductive plates 20, 22 and the interplate dielectric layer 24 are selected as a design choice for the MIM capacitor 18. The bottom and top conductive plates 20, 22 and the interplate dielectric layer 24 are patterned by a series of conventional lithography and etching processes so that a portion of the bottom conductive plate 20 that projects laterally outside of the footprint of the top conductive plate 22 and the interplate dielectric layer 24.

An etch stop layer 26 is disposed as a cap on the top conductive plate 22 between the top conductive plate 22 and the top surface 25 of the dielectric layer 12. Another etch stop layer 28 is disposed as a cap on the portion of the bottom conductive plate 20 projects laterally outside of the footprint of the top conductive plate 22 and the interplate dielectric layer 24. Yet another etch stop layer 30 is disposed as a cap on dielectric layer 14 and intervenes between dielectric layer 14 and the bottom surface 27 of dielectric layer 12 so that dielectric layers 12, 14 are in indirect contact. The etch stop layers 26, 28, 30 may be formed from any material that etches selectively to the material forming the dielectric layer. For example, the etch stop layers 26, 28, 30 may be thin films composed of $Si_3N_4$, silicon carbonitride (SiCN), silicon oxycarbonitride (SiOCN), or silicon carbide (SiC) deposited by, for example, plasma enhanced chemical vapor deposition (PECVD).

The bottom conductive plate 20 is separated from the bottom surface 27 of dielectric layer 12, which has a thickness, t, measured between the top and bottom surfaces 25, 27, by a partial thickness of the dielectric material of the dielectric layer 12. Dielectric layer 14 is in indirect contact with the bottom surface 27 of dielectric layer 12 because of the presence of the intervening etch stop layer 30.

The dielectric layers 12, 14 may be composed of an electrically-insulating dielectric material deposited by a conventional method understood by a person having ordinary skill in the art. In one embodiment, the dielectric layers 12, 14 may be composed of $SiO_2$ or fluorine-doped silicon glass (FSG) deposited by a CVD process or a PECVD process. Alternatively, the dielectric material constituting dielectric layers 12, 14 may be characterized by a relative permittivity or dielectric constant smaller than the dielectric constant of silicon dioxide, which is about 3.9. In one embodiment, the dielectric material may be characterized by a dielectric constant of about 3.0 or less. Fabricating the dielectric layers 12, 14 from such low-k materials may operate to lower the capacitance of the completed interconnect structure as understood by a person having ordinary skill in the art.

Candidate low-k dielectric materials for dielectric layers 12, 14 include, but are not limited to, porous and nonporous spin-on organic low-k dielectrics, porous and nonporous inorganic low-k dielectrics, such as organosilicate glasses, and combinations of organic and inorganic dielectrics. A particularly suitable inorganic low-k dielectric for use in dielectric layers 12, 14 may be hydrogen-enriched silicon oxycarbide (SiCOH) deposited, for example, by a deposition recipe based on PECVD and having a dielectric constant of about 3.0 or less. The composition and properties of SiCOH may vary contingent upon the selection of deposition conditions and source gases.

The bottom and top conductive plates 20, 22 of the MIM capacitor 18 in dielectric layer 12 and the conductive feature 16 in dielectric layer 14 are disposed at different depths relative to the top surface 25 of dielectric layer 12. As a result, establishing electrical contact with these different structural elements requires the formation of multiple-height vias in the dielectric layer 12, as described below.

Vias, of which vias 32, 34, 36, 38 are representative, are formed in the dielectric layer 12 by patterning the constituent dielectric material using conventional lithography and etch operations characteristic of a damascene process. To that end, a resist layer 40 is applied to the top surface 25 of dielectric layer 12, exposed to radiation to impart a latent image of a via pattern, and developed to transform the latent image of the via pattern into a final image pattern with laterally dispersed surface areas of dielectric layer 12 unmasked at the future sites of vias 32, 34, 36, 38. Unmasked regions of dielectric layer 12 at these sites are removed with an etching process, such as reactive ion etching (RIE), capable of producing substantially vertical sidewalls for vias 32, 34, 36, 38. The etching process forming vias 36, 38 stops on the etch stop layer 26. The etching process is continued with a different etch chemistry to extend the vias 36, 38 through the etch stop layer 26 to the depth of the top conductive plate 22, after which vias 36, 38 open onto a top surface 39 of the top conductive plate 22 of MIM capacitor 18. The etching process is interrupted and any overetching is limited to prevent penetration of the vias 36, 38 into the top conductive plate 22.

Via 32 has sidewalls 31a, 31b in nominal alignment with the conductive feature 16. Via 34 has sidewalls 33a, 33b in nominal alignment with the bottom conductive plate 20 of the MIM capacitor 18. Vias 32, 34, however, are only partially etched and, therefore, the sidewalls 31a, 31b and 33a, 33b fail to extend to their full depth at the conclusion of this fabrication stage. Via 36 has sidewalls 35a, 35b penetrating from the top surface 25 into the dielectric layer 12 that are in nominal alignment with one portion of the top conductive plate 22 and intersect the top conductive plate 22. Via 38 has sidewalls 37a, 37b penetrating from the top surface 25 into the dielectric layer 12 that are in nominal alignment with another portion of the top conductive plate 22 and intersect the top conductive plate 22. With the exception of the exposed portions of the top surface 39 of the top conductive plate 22, the vias 32, 34, 36, 38 are bounded along the sidewalls and bottom by the dielectric material of dielectric layer 12.

Figure 2:
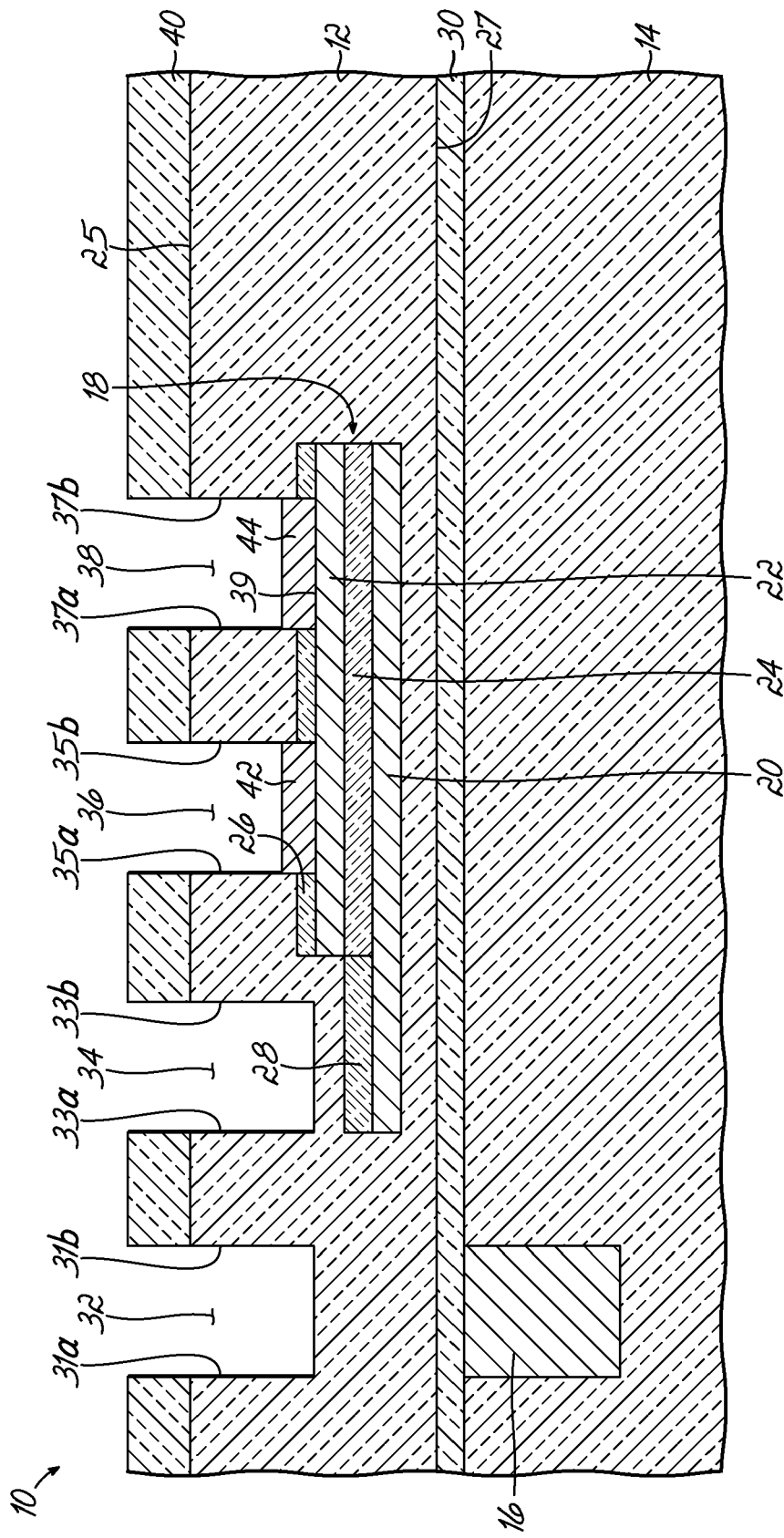
FIGS. 2-5 are diagrammatic cross-sectional views of the portion of the BEOL wiring structure and the MIM inductor of FIG. 1 at a series of subsequent fabrication stages.

With reference to FIG. 2 in which like reference numerals refer to like features in FIG. 1 and at a subsequent fabrication stage, conductive plugs in the form of conductive layers 42, 44 are applied that directly contact the respective portions of the top surface 39 of the top conductive plate 22, which are exposed at the bottoms of the vias 36, 38. The thickness of the conductive layers 42, 44 is significantly less than the full height of the vias 36, 38 so that the layers 42, 44 only partially fill the vias 36, 38. Conductive layer 42 bridges the space between the sidewalls 35a, 35b of via 36 to connect sidewall 35a with sidewall 35b and overlies the portion of the top surface 39 of the top conductive plate 22 aligned with via 36. As a result, this portion of the top surface 39 of the top conductive plate 22 aligned with via 36 is covered by an etch stop. Similarly, conductive layer 44 bridges the space between the sidewalls 37a, 37b of via 38 to connect sidewall 37a with sidewall 37b and overlies the portion of the top surface 39 of the top conductive plate 22 aligned with via 38. As a result, this portion of the top surface 39 of the top conductive plate 22 aligned with via 38 is covered by an etch stop.

The conductive layers 42, 44 may be composed of a conductor formed by a selective deposition process that deposits the conductive layers 42, 44 on the material of the top conductive plate 22 without also depositing conductor on the sidewalls 35a, 35b and 37a, 37b bordering the vias 36, 38. In addition, the selectively deposited conductor does not deposit on the sidewalls 31a, 31b and 33a, 33b of vias 32, 34 nor their bottoms between sidewalls 31a, 31b or sidewalls 33a, 33b. The latter attribute preserves the ability to resume the interrupted etching process and continue the etching of vias 32, 34 to greater respective depths into the dielectric layer 12. A conventional cleaning process may precede the selective deposition process.

In one embodiment, the conductor constituting conductive layers 42, 44 may be deposited using an electroless deposition process. In electroless deposition, a thin film of conductive material is formed on catalytically-active surfaces wetted by a chemical bath as a complexed metal ion contained in the chemical bath is reduced by a reducing agent also present in the chemical bath. The reducing agent functions to convert the complexed metal ions to a zero-valence state at the catalytically-active surfaces to form a continuous metal film. The top conductive plate 22 of the MIM capacitor 18 is catalytically active to an extent sufficient to promote the deposition of the metal thin films constituting the conductive layers 42, 44. However, the dielectric material of dielectric layer 12 lacks the ability to sustain catalytic activity and remains uncoated.

The process conditions for the electroless deposition process are chosen to endow the conductive layers 42, 44 with favorable material properties, including but not limited to a low resistivity and good adhesion to the constituent material of the top conductive plate 22.

The conductive layers 42, 44 may be composed of cobalt or a cobalt-containing material consisting of cobalt as a primary component and one or more elements selected from tungsten (W), phosphorus (P), boron (B), tin (Sn), molybdenum (Mo), or another suitable element as an alloy, a dopant, or a non-equilibrium mixture. In a specific embodiment, the conductor constituting the conductive layers 42, 44 may be composed of cobalt tungsten phosphide (CoWP). Solutions appropriate for chemical baths used to electrolessly deposit CoWP include a source of tungsten ions such as sodium or ammonium tungstate, a source of cobalt ions such as cobalt chloride or cobalt sulfate, a source of phosphorus ions, and other complexing agents, surfactants, and pH-adjusting agents. Electroless deposited CoWP films are generally limited to a maximum about 8 to about 10 atomic percent phosphorous and, in one embodiment, may have a composition of about 90 atomic percent cobalt, about 2 atomic percent tungsten, and about 8 atomic percent phosphorus.

In an alternative embodiment, the conductor in conductive layers 42, 44 may be deposited by a low temperature CVD process, such as a room temperature or near room temperature CVD process. The CVD process entails inducing a chemical reaction between a metal precursor and a co-reactant gas in the vicinity of the BEOL wiring structure 10. A solid reaction product is selectively deposited as a layer on the exposed portions of the top conductive plate 22, but not on the sidewalls 35a, 35b of via 36 or the sidewalls 37a, 37b of via 38 nor on the dielectric material of layer 12 bordering the vias 32, 34. The conditions for the low temperature CVD process are selected to provide a thin film that is highly conductive (i.e., low resistance) and that exhibits good adhesion to the material constituting the top conductive plate 22. Acceptable process conditions for providing these properties are known to a person having ordinary skill in the art, as are the particulars of such low temperature CVD processes.

In particular, the conductor in conductive layers 42, 44 may be composed of ruthenium (Ru) or a ruthenium-containing material, such as ruthenium oxide ($RuO_x$), formed using a suitable volatile metal precursor of ruthenium and a co-reactant gas, such as oxygen ($O_2$), (NO) or ($N_2O$), during the low temperature CVD process. Suitable volatile metal precursors of ruthenium may consist of ligands of the types cyclopentadienyls, carobonyls, and amidinates to which functional groups (e.g., an alkyl group) may be added or modified. Other refractory metals, such as W, may be selectively deposited as the conductor constituting conductive layers 42, 44 by a low temperature CVD process as understood by a person having ordinary skill in the art.

In this embodiment of the invention, the resist layer 40 remains resident on the top surface 25 of dielectric layer 12 when the conductive layers 42, 44 are formed in vias 36, 38. The presence of the resist layer 40 may require an adjustment to the process conditions for electroplating or electroless deposition, or an adjustment to the process conditions for the low temperature CVD process. In particular, the process temperature for the low temperature CVD process is selected so that the via pattern in the resist layer 40 is not significantly altered when the conductive layers 42, 44 are deposited. This promotes the successful resumption of the etching process intended to deepen the partially-etched vias 32, 34. The retention of the resist layer 40 may be governed by the feature size of vias 32, 34, 36, 38, which may be subject to tight ground rules or tight pitch wire requirements that prohibit stripping resist layer 40 before depositing the conductive layers 42, 44 and then reapplying another patterned resist layer before resuming the etching process to deepen vias 32, 34.

Figure 3:
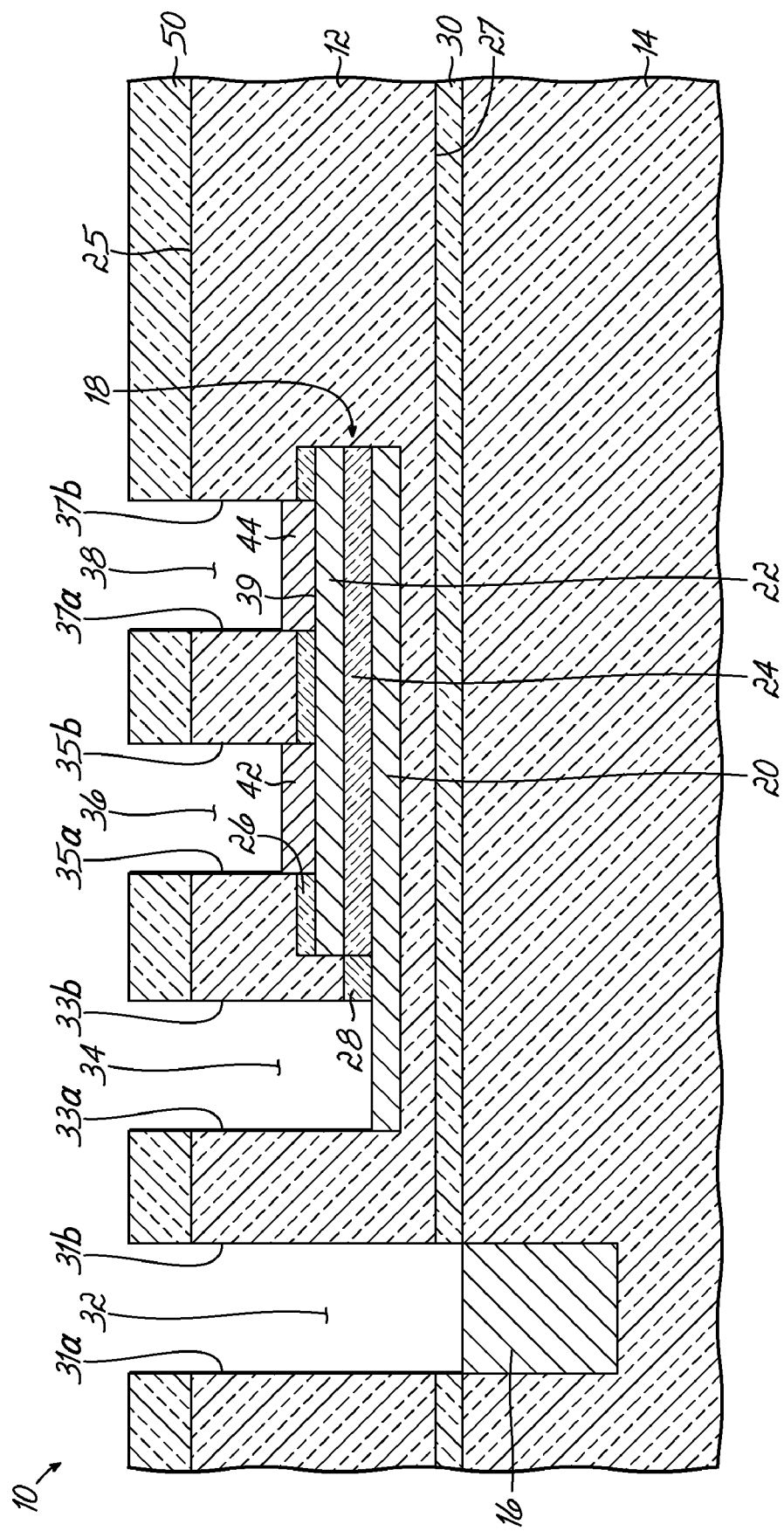

With reference to FIG. 3 in which like reference numerals refer to like features in FIG. 2 and at a subsequent fabrication stage, the sidewalls 31a, 31b of the partially-etched via 32 and the sidewalls 33a, 33b, of the partially-etched via 34 are deepened by removing the unmasked regions of dielectric layer 12 with an etching process, such as RIE, capable of producing substantially vertical sidewalls. The patterned resist layer 40 continues to operate as an etch mask as the etching process for vias 32, 34 eventually stops when vias 32, 34 open onto the respective etch stop layers 28, 30. The etching process is continued with a different etch chemistry to extend the sidewalls 31a, 31b of via 32 through the etch stop layer 30 to the depth of the conductive feature 16 and the sidewalls 33a, 33b of via 34 through the etch stop layer 28 to the depth of the bottom conductive plate 20. Via 32 opens onto the conductive feature 16 and the sidewalls 31a, 31b intersect the conductive feature 16. Via 34 opens onto the bottom conductive plate 20 of the MIM capacitor 18 and the sidewalls 33a, 33b intersect the bottom conductive plate 20.

The conductive layers 42, 44 operate as respective etch masks that prevent the sidewalls 35a, 35b of via 36 and the sidewalls 37a, 37b of via 38 from being extended in depth. In particular, the conductive layers 42, 44 protect the covered portions of the top conductive plate 22 of MIM capacitor 18 against removal by the etching process extending the depth of vias 32, 34. Therefore, the conductive layers 42, 44 protect against a failure mechanism caused by penetration of vias 32, 34 into the top conductive plate 22 and potentially penetration through the thickness of the top conductive plate 22. As a result, the failure mechanism experienced in conventional multiple-depth etching processes involving BEOL passive elements, like the MIM capacitor 18 formed in the BEOL wiring structure 10, is eliminated.

Figure 4:
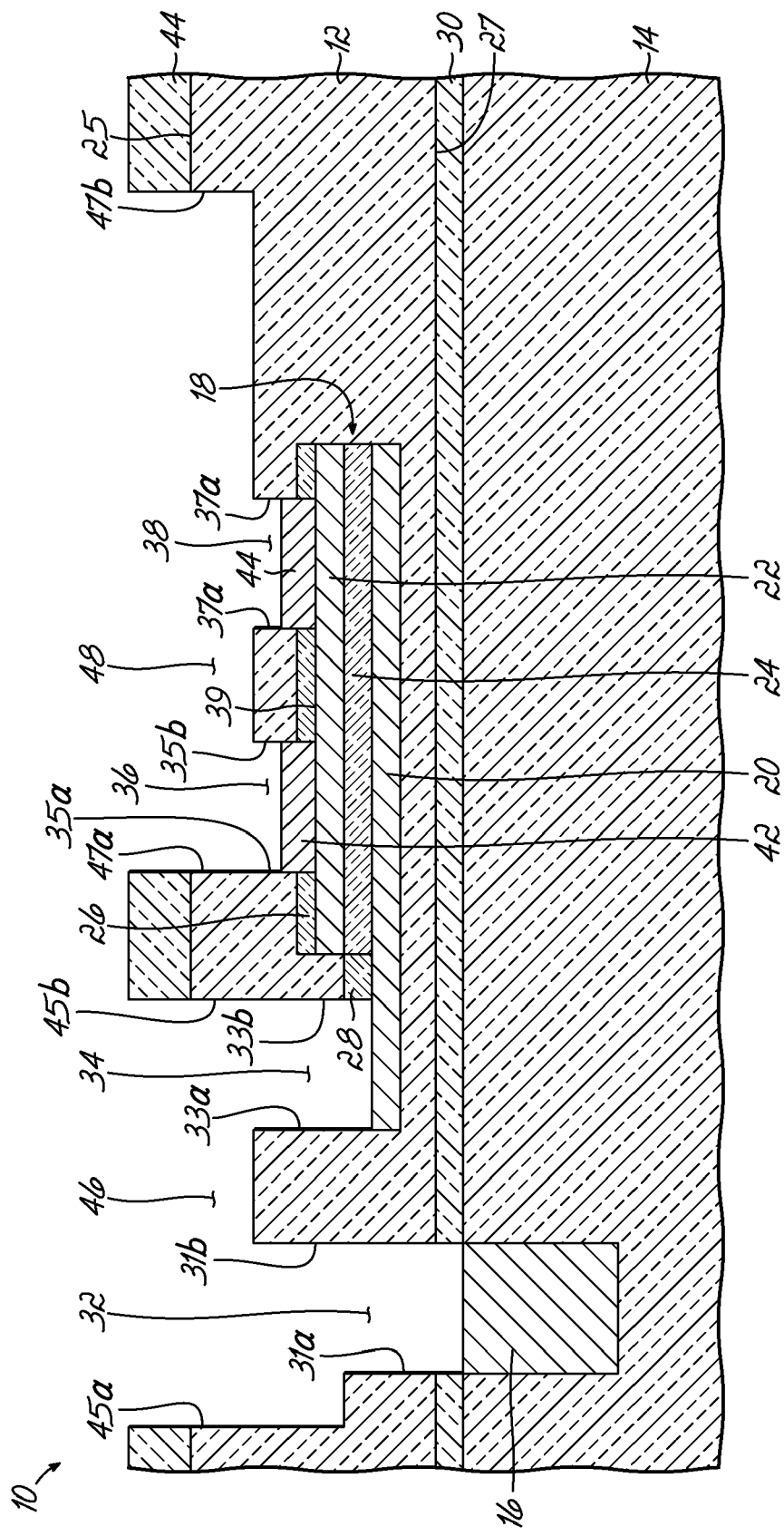

With reference to FIG. 4 in which like reference numerals refer to like features in FIG. 3 and at a subsequent fabrication stage, resist layer 40 is stripped from dielectric layer 12 by, for example, a wet chemical stripper. Troughs or trenches, of which trenches 46, 48 are representative, are formed in the dielectric layer 12 by patterning the constituent dielectric material using a conventional lithography and etch process. To that end, a resist layer 50 is applied to the top surface 25 of dielectric layer 12, exposed to radiation to impart a latent image of a trench pattern, and developed to transform the latent image of the trench pattern into a final image pattern with laterally dispersed surface areas of dielectric layer 12 unmasked at the future sites of trenches 46, 48. Trenches 46, 48 are formed by removing the unmasked regions of dielectric layer 12 with an etching process, such as RIE, capable of producing substantially vertical sidewalls.

Trench 46 includes sidewalls 45a, 45b that extend partially through the dielectric layer 12. Vias 32, 34 are within the perimeter bounded by the sidewalls 45a, 45b of trench 46 and, therefore, communicate with trench 46. Trench 48 also includes sidewalls 47a, 47b that extend partially through the dielectric layer 12. Vias 36, 38 are within the perimeter bounded by the sidewalls 47a, 47b of trench 48 and, therefore, communicate with trench 48. Consequently, the conductive layers 42, 44 continue to protect the covered portions of the top conductive plate 22 during the etching process defining the trenches 46, 48.

The vias 32, 34, 36, 38 and trenches 46, 48 comprise a dual-damascene pattern formed by a via-first, trench-last process sequence. In an alternative embodiment, the vias 32, 34, 36, 38 and the trenches 46, 48 may be formed using a trench-first, via-last dual-damascene process. The ability to perform dual damascene process steps independent of order is familiar to a person having ordinary skill in the art. In yet another alternative embodiment consistent with single-damascene processes, the vias 32, 34, 36, 38 may be filled with a conductor and then the trenches 46, 48 may be formed in another dielectric layer (not shown) deposited on dielectric layer 12.

Figure 5:
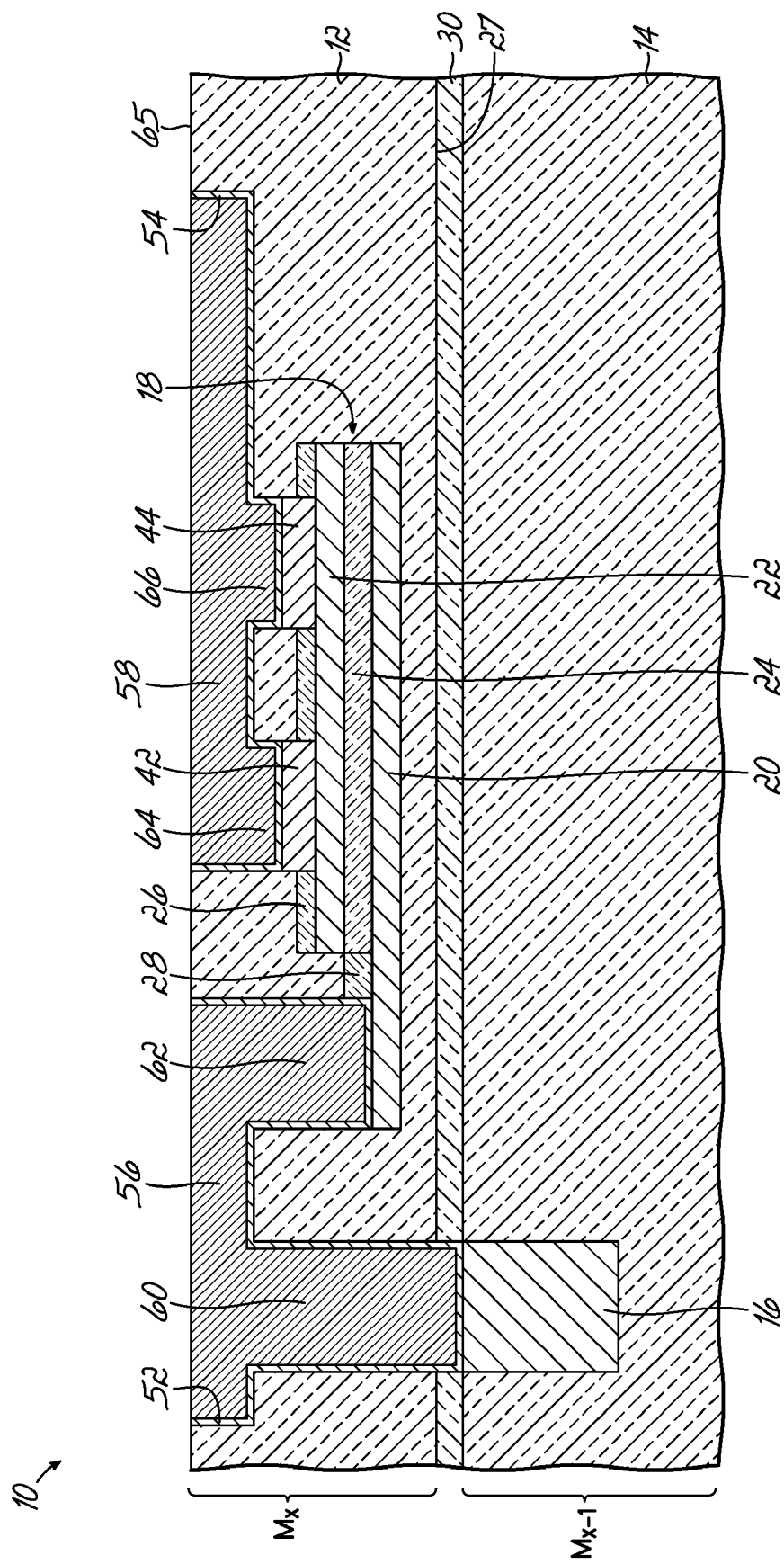

With reference to FIG. 5 in which like reference numerals refer to like features in FIG. 4 and at a subsequent fabrication stage, resist layer 50 is removed from dielectric layer 12 by, for example, a chemical stripper and liner layers 52, 54 are applied in the vias 32, 34, 36, 38 and trenches 46, 48. Liner layers 52, 54 may be composed of any conductive material or multilayer combination of conductive materials recognized by a person having ordinary skill in the art. Liner layers 52, 54 may comprise a conductive material such as TaN, TiN, Ta, Ti, W, Ru, iridium (Tr), rhodium (Rh), platinum (Pt), chromium (Cr), niobium (Nb), or another suitable conductive material or layered combination of conductive materials with properties suitable to operate as a diffusion barrier and an adhesion promoter for a subsequent metal plating process to fill the vias 32, 34, 36, 38 and trenches 46, 48. The liner layers 52, 54 may be deposited, for example, by conventional deposition processes well known to those skilled in the art, including but not limited to a physical vapor deposition (PVD) process, ionized-PVD (iPVD), ALD, plasma-assisted ALD, CVD, and PECVD.

Liner layer 52 coats the portion of the conductive feature 16 exposed at the bottom of via 32 and the portion of the top conductive plate 22 exposed at the bottom of via 34, as well as sidewalls 31a, 31b of via 32, sidewalls 33a, 33b of via 34, and sidewalls 45a, 45b of trench 46. Liner layer 54 coats the conductive layers 42, 44 that operate as etch stops in vias 36, 38, as well as sidewalls 35a, 35b of via 36, sidewalls 37a, 37b of via 38, and sidewalls 47a, 47b of trench 48. Consequently, the liner layer 54 is in direct contact with the conductive layers 42, 44. The liner layers 52, 54 are relatively thin so that a majority of the open volumes inside the vias 32, 34, 36, 38 and the trenches 46, 48 remains unfilled.

Wires 56, 58 are formed in the open spaces inside the trenches 46, 48, respectively, and conductive layers 60, 62, 64, 66 are formed in the open spaces inside the vias 32, 34, 36, 38, respectively. Wires 56, 58 and conductive layers 60, 62, 64, 66 are composed of a conductor such as copper (Cu), aluminum (Al), alloys of these primary metals such as AlCu, W, and other similar metals. The conductor is deposited as a blanket layer by conventional deposition processes, such as CVD, PECVD, an electrochemical process such as electroplating or electroless plating, chemical solution deposition, PVD, DC or RF sputtering, and the like. A thin seed layer (not shown) may be deposited inside the vias 32, 34, 36, 38 and trenches 46, 48 to promote the deposition process. After the blanket deposition, portions of the conductor fill the vias 32, 34, 36, 38 and trenches 46, 48 and cover the field of the dielectric layer 12. A chemical-mechanical polishing (CMP) process is used to remove excess conductor from the field of the dielectric layer 12 and to planarize a top surface 65.

The conductive layers 60, 62, 64, 66 define a via level in the BEOL wiring structure 10 that connects conductive features, such as conductive feature 16, in metallization level ($M_{x-1}$) with conductive features, such as wires 56, 58, in metallization level ($M_x$). Conductive layer 60 in via 32, wire 56, and conductive layer 62 in via 34 connect the conductive feature 16 with the bottom conductive plate 20 of the MIM capacitor 18. Conductive layer 64 in via 36 and conductive layer 66 in via 38 connect the top conductive plate 22 of the MIM capacitor 18 with the wire 58. Conductive layer 42 and a portion of liner layer 54 are disposed between conductive layer 64 and the top conductive plate 22. Conductive layer 44 and a portion of liner layer 54 are disposed between conductive layer 66 and the top conductive plate 22. Stacked tri-layer via conductors are defined in each of the vias 36, 38 for current flow to or from the top conductive plate 22.

The BEOL wiring structure 10 may be reproduced or replicated across the surface of the substrate by the fabrication procedure described in FIGS. 1-5. Additional interconnect levels may be stacked above or below the BEOL wiring structure 10 by fabrication process similar to those described in relation to FIGS. 1-5.

Figure 6:
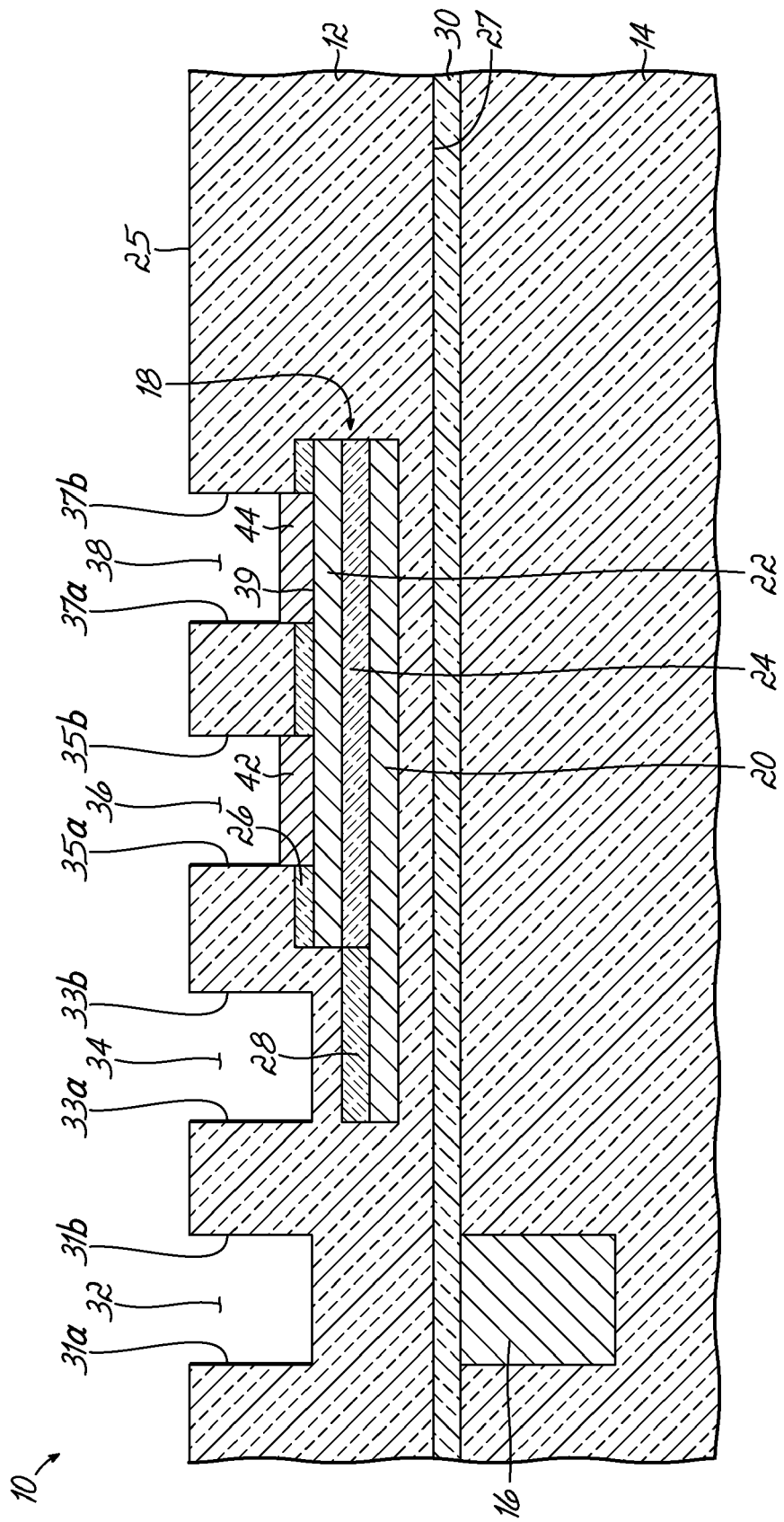
FIG. 6 is a diagrammatic cross-sectional view similar to FIG. 2 illustrating an alternative embodiment of the invention.

With reference to FIG. 6 in which like reference numerals refer to like features in FIG. 2 and in accordance with an alternative embodiment, the MIM capacitor 18 may be fabricated without reliance upon the resist layer 40 (FIG. 2). The BEOL wiring structure 10, after the conclusion of the process stage of FIG. 5, is substantially identical to the construction depicted in FIG. 5, other than the physical dimensions of the structure 10. For example, the thickness of the wiring may exceed 2 microns. This embodiment of the BEOL wiring structure 10 may be colloquially referred to as a thick wire structure. A representative method for forming such thick wire structures with a dual-damascene process is disclosed in commonly-assigned application Ser. No. 11/275,604, filed on Jan. 19, 2006 and published on Aug. 16, 2007 as Publication No. 2008/0190718; the disclosure of which is hereby incorporated by reference herein in its entirety.

In this embodiment of the invention, the resist layer 40 is removed before the conductive layers 42, 44 are formed in vias 36, 38. This relaxes the process conditions for electroplating or electroless deposition, or the process conditions for the low temperature CVD process, because another resist layer (not shown) similar to resist layer 40 can be applied before the resumption of the etching process to deepen the partially etched vias 32, 34 to the depths of the bottom conductive plate 20. The via openings in the resist layer (not shown) applied before the resumption of the etching process are registered with the via openings in the resist layer 40. For example, the process temperature may be increased to as high as 400° C. in the absence of photoresist on the top surface 25 of dielectric layer 12. The ability to remove resist layer 40 may be governed by the feature size of vias 32, 34, 36, 38, which may be characterized as super thick analog wires.

Figure 7:
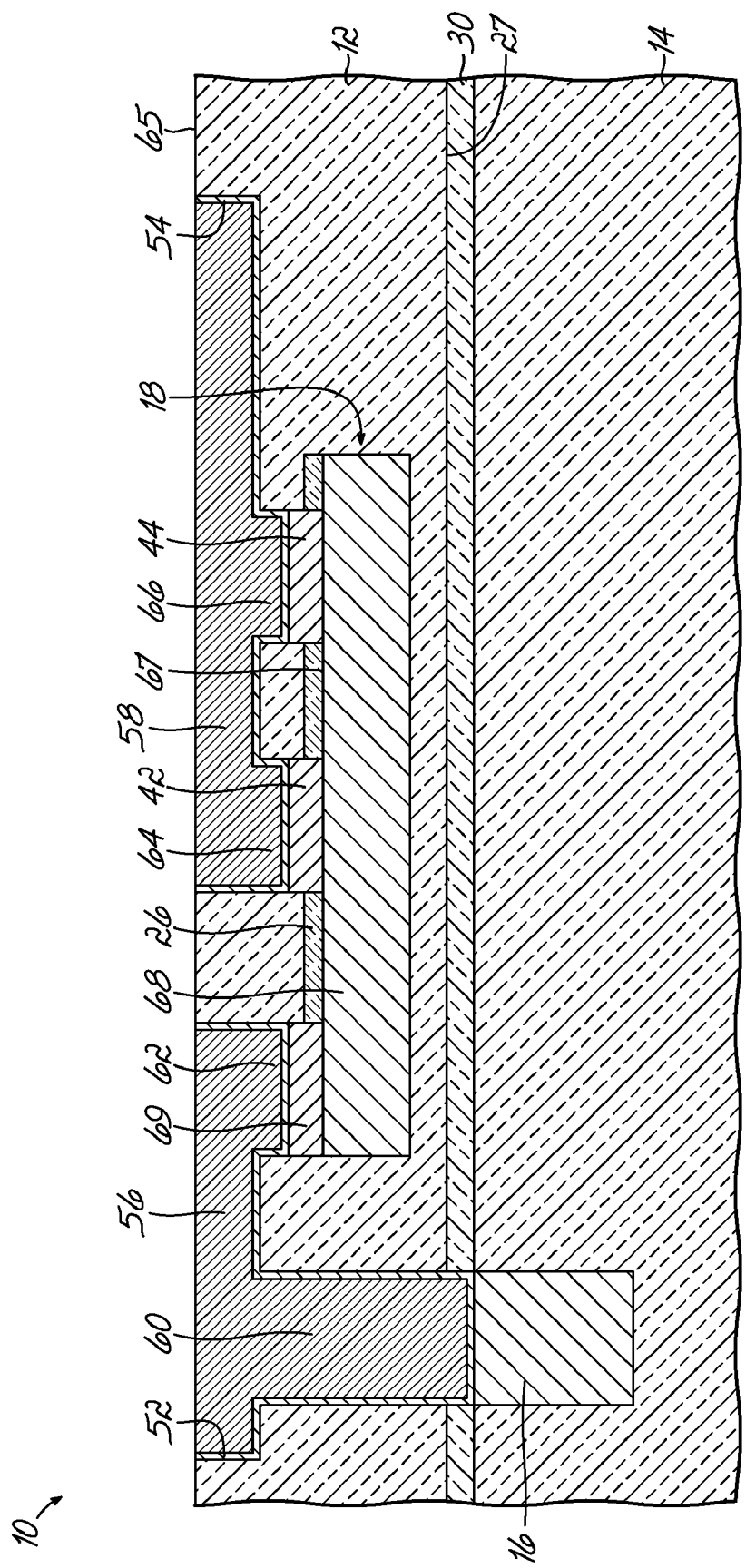
FIG. 7 is a diagrammatic cross-sectional view similar to FIG. 5 illustrating an alternative embodiment of the invention in which the passive element integrated into the BEOL wiring structure is a thin film resistor.

With reference to FIG. 7 in which like reference numerals refer to like features in FIG. 5 and in accordance with an alternative embodiment, the MIM capacitor 18 may be replaced in the wiring structure 10 by another type of on-chip passive circuit element, such as a thin film resistor 68. Alternatively, MIM capacitor 18 (FIG. 5) and thin film resistor 68 may be included at different locations in the wiring structure 10.

Similar to the bottom and top conductive plates 20, 22 of the MIM capacitor 18 (FIG. 5), the thin film resistor 68 may be composed of a body of a refractory metal, such as TiN, TaN, Ta, W, WN, ternary materials like TiSiN, TaSiN, and WSiN, multi-layered combinations of these materials such as either W or Ta clad below and above with either TiN or TaN, and other like materials. The refractory material(s) constituting the thin film resistor 68 may be deposited with a DC or RF sputtering technique. The resistance value of the thin film resistor 68 is determined by selection of, among other variables, the composition, the thickness, and the planar geometry of the deposited and shaped material.

In this embodiment, via 34 opens onto a top surface 67 of the resistor and, as a result, an additional conductive layer 69, which is similar in physical construction and constructed by the same process as conductive layers 42, 44, is formed in via 34 before etching is continued to extend via 32 to the conductive feature 16. Conductive layer 69 is formed concurrently with the conductive layers 42, 44. Conductive layers 42, 44, 69 are disposed between conductive layers 64, 66, 69 and the body of the thin film resistor 68, respectively, which provides a tri-layer via conductor in each of the vias 34, 36, 38 for current flow to and from the thin film resistor 68.

Figure 8:
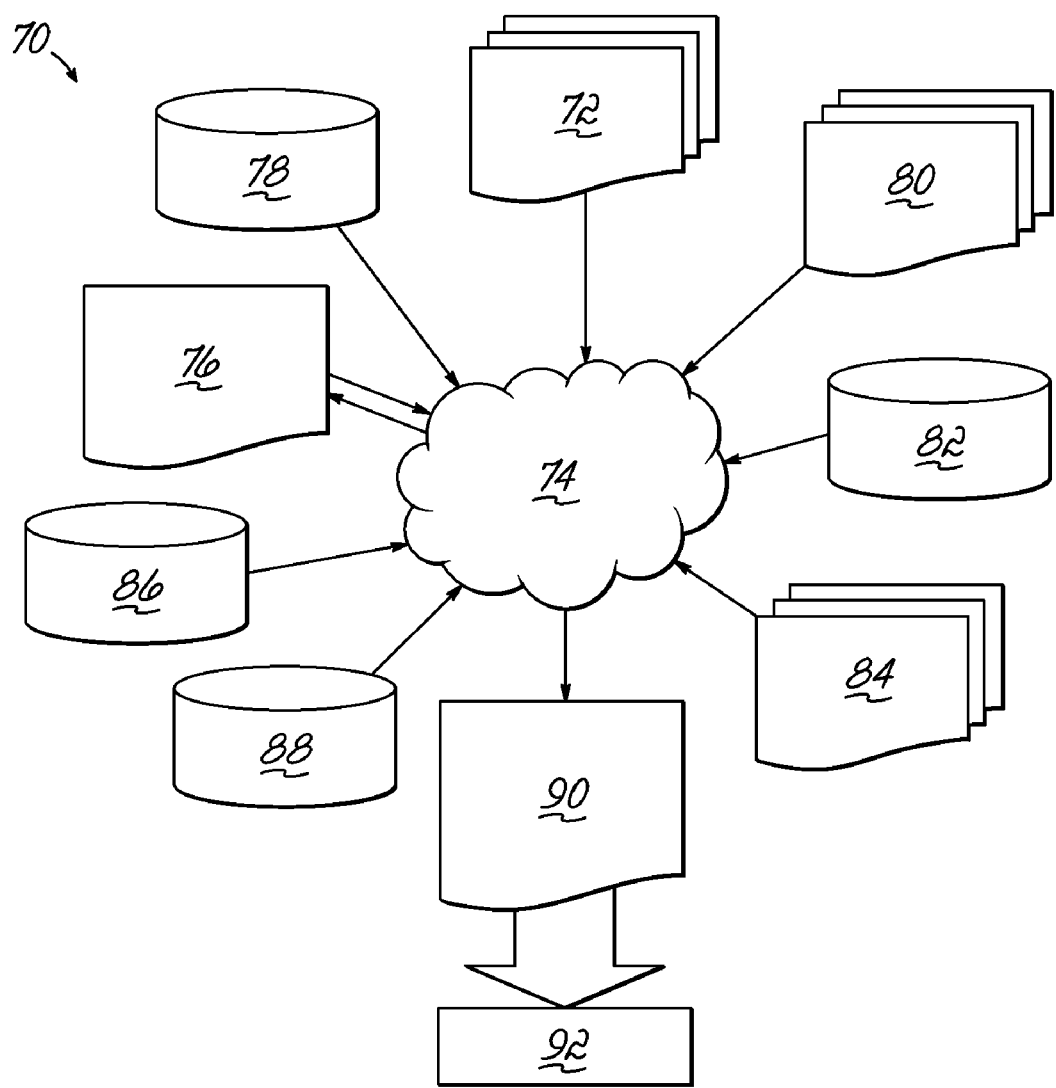
FIG. 8 is a flow diagram of a design process used in semiconductor design, manufacture, and/or test.

FIG. 8 shows a block diagram of an exemplary design flow 70 used for example, in semiconductor IC logic design, simulation, test, layout, and manufacture. Design flow 70 includes processes and mechanisms for processing design structures or devices to generate logically or otherwise functionally equivalent representations of the design structures and/or devices described above and shown in FIG. 5, 6, or 7. The design structures processed and/or generated by design flow 70 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 70 may vary depending on the type of representation being designed. For example, a design flow 70 for building an application specific IC (ASIC) may differ from a design flow 70 for designing a standard component or from a design flow 70 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 72 that is preferably processed by a design process 74. Design structure 72 may be a logical simulation design structure generated and processed by design process 74 to produce a logically equivalent functional representation of a hardware device. Design structure 72 may also or alternatively comprise data and/or program instructions that when processed by design process 74, generate a functional representation of the physical structure of a hardware device. Whether representing functional and/or structural design features, design structure 72 may be generated using electronic computer-aided design (ECAD) such as implemented by a core developer/designer. When encoded on a machine-readable data transmission, gate array, or storage medium, design structure 72 may be accessed and processed by one or more hardware and/or software modules within design process 74 to simulate or otherwise functionally represent an electronic component, circuit, electronic or logic module, apparatus, device, or system such as those shown in FIG. 5, 6, or 7. As such, design structure 72 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 74 preferably employs and incorporates hardware and/or software modules for synthesizing, translating, or otherwise processing a design/simulation functional equivalent of the components, circuits, devices, or logic structures shown in FIG. 5, 6, or 7 to generate a netlist 76 which may contain design structures such as design structure 72. Netlist 76 may comprise, for example, compiled or otherwise processed data structures representing a list of wires, discrete components, logic gates, control circuits, I/O devices, models, etc. that describes the connections to other elements and circuits in an integrated circuit design. Netlist 76 may be synthesized using an iterative process in which netlist 76 is resynthesized one or more times depending on design specifications and parameters for the device. As with other design structure types described herein, netlist 76 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 74 may include hardware and software modules for processing a variety of input data structure types including netlist 76. Such data structure types may reside, for example, within library elements 78 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 80, characterization data 82, verification data 84, design rules 86, and test data files 88 which may include input test patterns, output test results, and other testing information. Design process 74 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 74 without deviating from the scope and spirit of the invention. Design process 74 may also include modules for performing standard circuit design processes such as timing analysis, verification, design rule checking, place and route operations, etc.

Design process 74 employs and incorporates logic and physical design tools such as HDL compilers and simulation model build tools to process design structure 72 together with some or all of the depicted supporting data structures along with any additional mechanical design or data (if applicable), to generate a second design structure 90. Design structure 90 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 72, design structure 90 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 5, 6, or 7. In one embodiment, design structure 90 may comprise a compiled, executable HDL simulation model that functionally simulates the devices shown in FIG. 5, 6, or 7.

Design structure 90 may also employ a data format used for the exchange of layout data of integrated circuits and/or symbolic data format (e.g. information stored in a GDSII (GDS2), GL1, OASIS, map files, or any other suitable format for storing such design data structures). Design structure 90 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 5, 6, or 7. Design structure 90 may then proceed to a stage 92 where, for example, design structure 90: proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A back-end-of-line (BEOL) wiring structure comprising:
    a first dielectric layer having a top surface and a bottom surface;
    a passive element between the top surface and the bottom surface of the first dielectric layer;
    a first via in the first dielectric layer, the first via including a plurality of sidewalls that intersect a portion of the passive element;
    a first conductive layer disposed on the portion of the passive element and extending between the sidewalls of the first via;
    a second conductive layer disposed on the sidewalls of the first via and on the first conductive layer; and
    a third conductive layer disposed in the first via, the third conductive layer separated from the sidewalls of the first via and from the first conductive layer by respective portions of the second conductive layer.

2. The BEOL wiring structure of claim 1 wherein the first dielectric layer has a thickness measured between the top surface and the bottom surface, and further comprising:
    a second dielectric layer in contact with the bottom surface of the first dielectric layer;
    a conductive feature in the second dielectric layer; and
    a second via including a plurality of sidewalls that extend through the thickness of the first dielectric layer to the bottom surface so as to intersect the conductive feature.

3. The BEOL wiring structure of claim 2 wherein another portion of the second conductive layer is disposed on the sidewalls of the second via and on the conductive feature, another portion of the third conductive layer is disposed in the second via, and the portion of the third conductive layer is separated from the sidewalls of the second via and the conductive feature by the second conductive layer.

4. The BEOL wiring structure of claim 2 further comprising:
    a conductive wire disposed in the first dielectric layer, the conductive wire having an overlying relationship with the portion of the third conductive layer in the second via and the third conductive layer in the first via, and the conductive wire configured to electrically connect the portion of the third conductive layer in the second via with the third conductive layer in the first via.

5. The BEOL wiring structure of claim 1 wherein the first conductive layer is composed of cobalt tungsten phosphide.

6. The BEOL wiring structure of claim 1 wherein the first conductive layer is composed primarily of a refractory metal.

7. The BEOL wiring structure of claim 1 wherein the first conductive layer is composed primarily of cobalt, primarily of tungsten, or primarily of ruthenium.

8. The BEOL wiring structure of claim 1 further comprising:
    a trench extending partially through the first dielectric layer, the trench communicating with the first via; and
    a conductive wire in the trench, the conductive wire connected by the first, second, and third conductive layers with the portion of the passive element.

9. The BEOL wiring structure of claim 1 wherein the passive element is a metal-insulator-metal capacitor that includes a bottom conductive plate, a top conductive plate closer to the top surface of the first dielectric layer than the bottom conductive plate, and an interplate dielectric layer between the top and bottom conductive plates, the portion of the passive element is a surface region of the top conductive plate, and the top conductive plate and the first conductive layer are in direct contact.

10. The BEOL wiring structure of claim 9 further comprising:
  a second via in the first dielectric layer, the second via including a plurality of sidewalls that intersect the bottom conductive plate so that the first and second vias have different heights relative to the top surface of the first dielectric layer.

11. The BEOL wiring structure of claim 10 further comprising:
  a second dielectric layer in contact with the bottom surface of the first dielectric layer;
  a conductive feature in the second dielectric layer; and
  a third via in the first dielectric layer, the third via including a plurality of sidewalls that extend to the bottom surface of the first dielectric layer to intersect the conductive feature so that the first, second, and third vias have different heights relative to the top surface of the first dielectric layer.

12. The BEOL wiring structure of claim 1 wherein the passive element is a thin film resistor composed of a body of a resistive material, and the portion of the passive element is a portion of the body of the thin film resistor that is in direct contact with the first conductive layer.

13. A design structure embodied in a machine readable medium for designing, manufacturing, or testing an integrated circuit, the design structure comprising:
  a first dielectric layer having a top surface, a bottom surface, and a thickness measured between the top surface and the bottom surface;
  a passive element between the top surface and the bottom surface of the first dielectric layer;
  a first via in the first dielectric layer, the first via including a plurality of sidewalls that intersect a portion of the passive element;
  a first conductive layer disposed on the portion of the passive element and connecting the sidewalls of the first via;
  a second conductive layer disposed on the sidewalls of the first via and on the first conductive layer; and
  a third conductive layer disposed in the first via, the third conductive layer separated from the sidewalls of the first via and from the first conductive layer by respective portions of the second conductive layer.

14. The design structure of claim 13 wherein the design structure comprises a netlist.

15. The design structure of claim 13 wherein the design structure resides on storage medium as a data format used for the exchange of layout data of integrated circuits.

16. The design structure of claim 13 wherein the design structure resides in a programmable gate array.

* * * * *